(12) United States Patent
Zimmermann

(10) Patent No.: US 12,424,938 B2
(45) Date of Patent: Sep. 23, 2025

(54) METHOD AND CIRCUIT FOR CURRENT CONTROL

(71) Applicant: AT-TRONIC GMBH, Lichtenstein / OT Roedlitz (DE)

(72) Inventor: Uwe Zimmermann, Lichtenstein / OT Roedlitz (DE)

(73) Assignee: AT-TRONIC GmbH, Lichtenstein / OT Roedlitz (DE)

( * ) Notice: Subject to any disclaimer, the term of this patent is extended or adjusted under 35 U.S.C. 154(b) by 0 days.

(21) Appl. No.: 18/881,037

(22) PCT Filed: Jul. 5, 2023

(86) PCT No.: PCT/IB2023/056950
§ 371 (c)(1),
(2) Date: Jan. 3, 2025

(87) PCT Pub. No.: WO2024/009230
PCT Pub. Date: Jan. 11, 2024

(65) Prior Publication Data
US 2025/0260318 A1   Aug. 14, 2025

(30) Foreign Application Priority Data
Jul. 6, 2022   (DE) ..................... 10 2022 116 806.9

(51) Int. Cl.
*H02M 3/155*   (2006.01)
*H02M 1/00*   (2006.01)

(52) U.S. Cl.
CPC ......... *H02M 3/155* (2013.01); *H02M 1/0009* (2021.05)

(58) Field of Classification Search
None
See application file for complete search history.

(56) References Cited

U.S. PATENT DOCUMENTS

| 7,154,253 B1 | 12/2006 | Gunther |
| 9,267,972 B2 | 2/2016 | Rossi et al. |

(Continued)

FOREIGN PATENT DOCUMENTS

| DE | 102012103904 A1 | 11/2013 |
| DE | 102014202350 A1 | 8/2014 |

(Continued)

OTHER PUBLICATIONS

Anonymous, "Control engineering—Wikipedia", Jul. 19, 2021 (Jul. 19, 2021), p. 1-32, Retrieved from: URL:https://de.wikipedia.org/w/index.php?title=Regelungstechnik&oldid=214014187, XP055920199, [found on May 11, 2022], p. 4 "Analog technology" and "Digital technology".

*Primary Examiner* — Jeffrey S Zweizig
(74) *Attorney, Agent, or Firm* — Laurence A. Greenberg; Werner H. Stemer; Ralph E. Locher

(57) ABSTRACT

A current control circuit has a first and a second load component and/or generator component between which a current flows in a first or in a second current direction. Two transistor switches are connected in series between the first and the second load component and/or generator component. Source or emitter terminals of the transistor switches are electrically short-circuited. Gate voltages of the transistor switches are set by analog transistor controllers. A current measurement device measures an actual current between the transistor switches. A digital controller specifies a first target current for the first current direction and a second target current for the second current direction to the transistor controllers. Depending on the respective difference between the actual current and the target current, corresponding gate voltages for the transistor switches are set by the transistor controllers to control the actual current through the transistor switches.

15 Claims, 1 Drawing Sheet

(56) References Cited

U.S. PATENT DOCUMENTS

| | | | |
|---|---|---|---|
| 9,831,715 B2 | 11/2017 | Zeuch et al. | |
| 10,862,324 B2 | 12/2020 | Tsujioka | |
| 11,075,623 B2 | 7/2021 | Schierling et al. | |
| 11,362,512 B2 * | 6/2022 | Schierling | H01B 3/002 |
| 11,509,301 B2 | 11/2022 | Gaudenz | |
| 2015/0028935 A1 | 1/2015 | Pantano et al. | |

FOREIGN PATENT DOCUMENTS

| | | |
|---|---|---|
| DE | 102013009991 A1 | 12/2014 |
| DE | 102018222554 A1 | 6/2020 |
| DE | 102020134291 A1 | 6/2022 |
| DE | 112017001674 B4 | 6/2022 |
| EP | 3159994 A1 | 4/2017 |
| WO | 2018172134 A1 | 9/2018 |
| WO | 2020165215 A1 | 8/2020 |

* cited by examiner

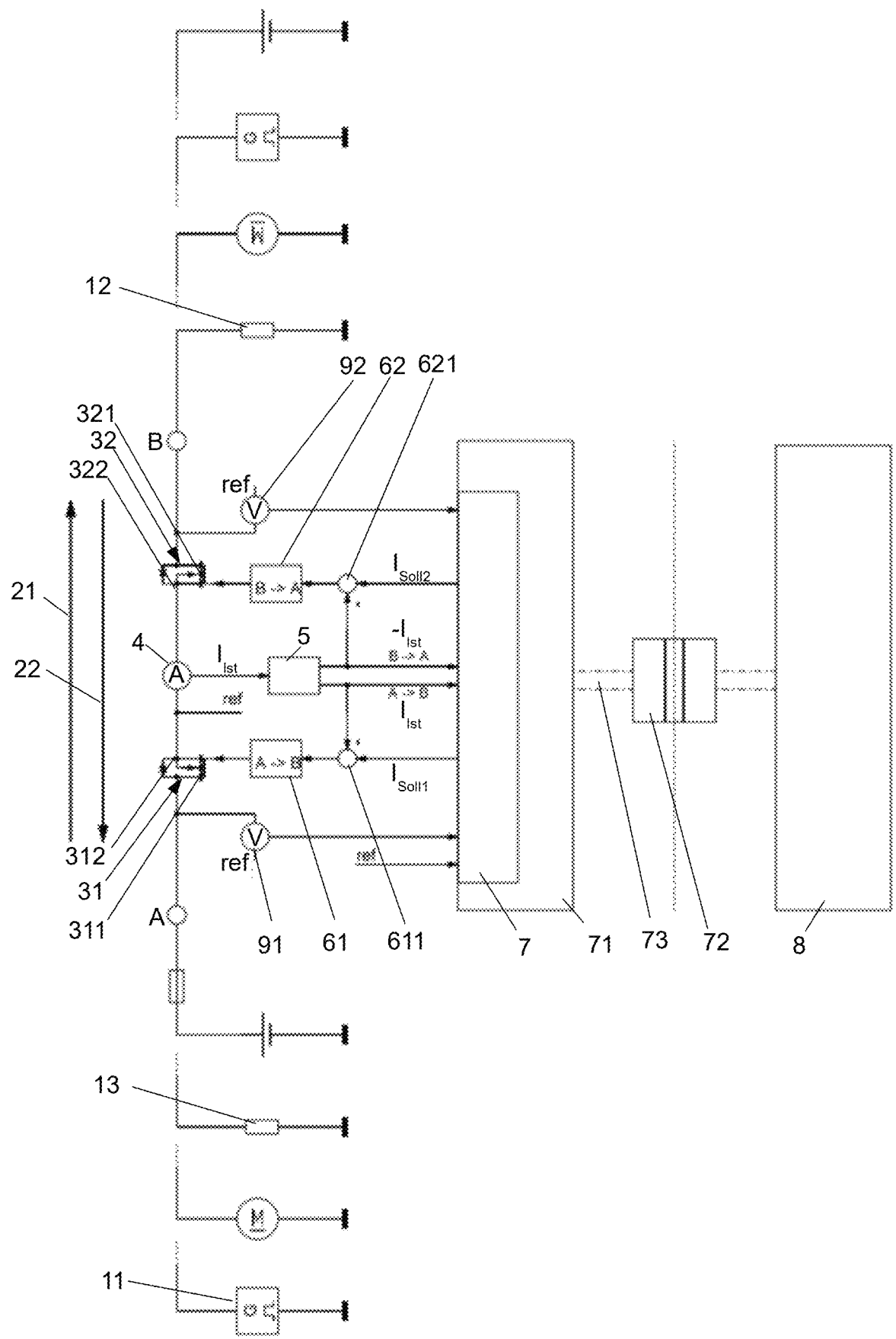

METHOD AND CIRCUIT FOR CURRENT CONTROL

FIELD AND BACKGROUND OF THE INVENTION

The present invention relates to a method for current control with a circuit having a first load and/or generator component and a second load and/or generator component, between which a current can flow in a first current direction or in a second current direction, and two transistor switches connected in series between the first load and/or generator component and the second load and/or generator component, wherein the source or emitter terminals of said transistor switches are electrically short-circuited, wherein gate voltages at gate terminals of the transistor switches are set by analog transistor controllers associated to the transistor switches, thus regulating an actual current through the transistor switches. The invention further relates to a circuit for current control with a first load and/or generator component and a second load and/or generator component, between which a current can flow in a first current direction and in a second current direction, and two transistor switches connected in series between the first load and/or generator component and the second load and/or generator component, wherein the source or emitter terminals of said transistor switches are electrically short-circuited, and analog transistor controllers associated to the transistor switches for setting gate voltages and thus regulating an actual current through the transistor switches.

In classic circuits, peak currents are typically permitted. To prevent damage to devices or systems caused by peak currents, the corresponding circuits have fuses that melt above certain currents and interrupt the respective circuit. Regardless, these circuits may experience EMV problems or increased circuit wear due to the high currents. In addition, in the known systems the melted fuse must be replaced with a new one.

Furthermore, it is often important to allow different currents in different current directions in electrical circuits.

Document WO 2020/165215 A1 describes an electrical switch with current regulation. For this purpose, a semiconductor switch in the form of two transistors connected in series whose source terminals are short-circuited is provided between an energy source and a consumer. A current sensor is provided in series with the semiconductor switch. The gates of the transistors are controlled by a control circuit depending on the current detected by the current sensor. The current consumed by the consumer can be limited by pulse width modulation.

From document WO 2018/172134 A1, a method for controlling a direct current switch located between an energy source and an electrical consumer is known. The DC switch has two transistor switches connected in series, whose source terminals are short-circuited and whose gates are controlled by a control device depending on the measured values of a current measuring device connected in series with the transistor switches. The control device is connected to a higher-level control via an interface. In this method, each of the transistor switches can be switched off individually. Furthermore, with the circuit described it is possible, for example, to set the trigger threshold of the DC switch for mains-side fault currents 25% higher than the trigger threshold for load-side fault currents.

There are currently no suitable circuits that can limit the respective current level in different current directions with minimal circuit effort.

SUMMARY OF THE INVENTION

It is therefore the object of the present invention to provide a method and a simple circuit for current control, with which current paths can be defined and/or short-circuit currents can be limited particularly safely and effectively.

The object is solved on the one hand by a method for current control with a circuit having a first load and/or generator component and a second load and/or generator component, between which a current can flow in a first current direction or in a second current direction, and two transistor switches connected in series between the first load and/or generator component and the second load and/or generator component, wherein source or emitter terminals of the transistor switches are electrically shortcircuited, wherein gate voltages at gate terminals of the transistor switches are set by analog transistor controllers associated, respectively, to the transistor switches and thus an actual current is regulated by the transistor switches, wherein the actual current is measured by a current measuring device between the transistor switches, wherein said actual current is forwarded to the transistor controllers, wherein the actual current or the actual current as amplified value is forwarded to a first one of the transistor controllers as first input signal of the first transistor controller and is forwarded invertedly to a second one of the transistor controllers as first input signal of the second transistor controller, the transistor controllers are each given a first target current for the first current direction and a second target current for the second current direction by a digital controller, and the transistor controllers set corresponding gate voltages for the transistor switches depending on the respective difference between the actual current and the respective target current and thus the actual current is regulated by the transistor switches.

The method according to the invention works in its simplest form as follows:

Between the first load and/or generator component and the second load and/or generator component, a current can flow both in a first current direction from the first to the second load and/or generator component and in a second current direction from the second to the first load and/or generator component.

If there is no fault in the circuit, the transistor switches connected in series between the first and second load and/or generator components are in saturation, i.e. they allow the respective current to flow in both current directions. Because the source or emitter terminals of the two transistor switches are short-circuited, they can serve as switches by appropriate gate control, allowing current to pass either only in the first current direction or only in the second current direction. In these cases, only one of the two transistor switches is closed, i.e. in saturation, while the other is blocked.

The current measuring device measures a current that flows between the first and the second load and/or generator component or vice versa and is tapped at a reference point between the transistor switches as the respective actual current.

Preferably, the actual current is amplified by a current measuring amplifier connected in series with the current measuring device. The current measuring amplifier is then connected in series between the current measuring device and the respective transistor controller.

The actual current or the amplified actual current is passed to a first of the transistor controllers as first input signal of the first transistor controller and inverted to a second of the transistor controllers as first input signal of the second transistor controller.

As second input signal, the digital controller specifies a first target current in the first current direction to the first transistor controller and a second target current in the second current direction to the second transistor controller. The respective target current specifies the maximum current that can flow between the first load and/or generator component and the second load and/or generator component in the first current direction or in the second current direction.

Each of the two analog transistor controllers generates an output signal in the form of a gate voltage supplied to the associated transistor switch. The respective output signals of the two transistor controllers depend on the difference between the respective actual and target current. The use of analog transistor controllers in the present invention enables a continuous and very fast response in real time to a changing actual current, which represents a significant advantage compared to the digital controls of transistor switches known from the prior art, such as WO 2020/165215 A1 or WO 2018/172134 A1.

Pulse width modulation does not occur in the present invention. Instead, in the method according to the invention, current is limited via a linear control of the transistor switches. This means that the transistor switches are in the linear range and not pulse width modulated during current limitation via the transistor controllers. While in document WO 2020/165215 A1 the current limitation is carried out via pulse width modulation, whereby the energy to be transmitted is limited via the pulse width ratio, in the present invention the energy for or during the current limitation in the transistor switches is converted via the power loss of the transistor switches.

In the present invention, if the actual current exceeds at least one target current specified by the digital controller for one of the current directions, the transistor controllers can control the transistor switches, respectively, in such a way that the respective current through the respective transistor is limited to the target current or even the respective current direction is blocked.

Because the transistor controllers work analogously, such limitation or blocking can occur continuously and in real time. In this way, components in the circuit can be protected from peak currents and thus from destruction without a fuse having to blow first. The current load on the circuit components can thus be minimized over time. This leads to a high level of security.

In an advantageous embodiment of the method according to the invention, voltage drops across the first load and/or generator component and across the second load and/or generator component are detected and transmitted to the digital controller.

In a suitable development of the method according to the invention, the controller continuously transmits the actual current and, if applicable, the voltage drops across the first load and/or generator component and across the second load and/or generator component to an external control unit via a digital coupler forming a galvanic isolation.

Preferably, when the actual current exceeds the respective predetermined target current over a predetermined period of time, the digital controller transmits a switch-off signal to at least one of the transistor controllers.

In an optional embodiment of the method according to the invention, if the actual current exceeds the respective specified target current over a predetermined period of time and the voltage drop across the load and/or generator component associated with this target current falls below a voltage target value, the respective target current is set to zero by the digital controller.

In a further advantageous variant of the method according to the invention, when the circuit is switched off, the target current is reduced in a ramp or step manner by the digital controller.

Furthermore, according to an embodiment of the method according to the invention, it is possible that when the circuit is switched on, the target current is increased in a ramp or step manner.

The target current specified by the digital controller can be symmetrical or asymmetrical for both current directions. If each of the transistor controllers is given its own target current, different peak currents can be permitted depending on the current path.

The object is further solved by a circuit for current control with a first load and/or generator component and a second load and/or generator component, between which a current can flow in a first current direction or in a second current direction, and two transistor switches connected in series between the first load and/or generator component and the second load and/or generator component, wherein the source or emitter terminals of the transistor switches are electrically short-circuited, and analog transistor controllers associated to the transistor switches for setting gate voltages and thus regulating an actual current through the transistor switches, wherein a current measuring device is connected between the transistor switches to measure the actual current, wherein the output of the current measuring device is connected to respective controller inputs of the transistor controllers for transmitting the respective measured actual current, wherein the actual current or the amplified actual current is forwarded to a first one of the transistor controllers as first input signal of the first transistor controller and is forwarded invertedly to a second one of the transistor controllers as first input signal of the second transistor controller, and controller inputs of the transistor controllers are connected to a digital controller for specifying at least one target current.

In the circuit according to the invention, the transistor switches replace electromechanical fuses and also improve their function. In principle, however, it is possible to use the circuit according to the invention as redundancy to a fuse. Conversely, at least one fuse can also be additionally used in the circuit according to the invention.

The fact that in the circuit according to the invention the current measuring device for measuring the actual current is connected in series between the transistor switches results in a simple, symmetrical circuit arrangement which enables simple signal processing and simple coordination of the transistor controllers. In addition, this makes the measurement and the reaction to the measurement very fast.

By using two separate transistor controllers in the circuit according to the invention, different current limiting values can be made possible for the respective current direction. Thus, in the present invention it is possible, for example, to "allow" current flow only in one direction and to "prohibit" or limit it in the other direction.

In a preferred embodiment of the circuit according to the invention, a first voltage measuring device is connected in parallel to the first load and/or generator component and a second voltage measuring device is connected in parallel to the second load and/or generator component.

The transistor switches are advantageously semiconductor transistors, such as MOSFETs or IGBTs.

Preferably, the transistor controllers are PI or PID controllers with operational amplifiers.

In an advantageous embodiment of the circuit according to the invention, the transistor controllers and the transistor switches are composed of several transistor controller and transistor switch units connected in parallel.

In a favorable variant of the circuit according to the invention, at least one of the transistor switches is composed of several semiconductor transistors connected in parallel to one another.

A preferred embodiment of the present invention, its structure, function and advantages are explained in more detail below with reference to a single FIGURE.

BRIEF DESCRIPTION OF THE FIGURE

The FIGURE is a schematic diagram of a circuit according to the invention.

DETAILED DESCRIPTION OF THE INVENTION

The FIGURE shows an embodiment of a circuit 1 according to the invention. The circuit 1 has a first load and/or generator component 11 and a second load and/or generator component 12. In the embodiment shown, the first load and/or generator component 11 is a generator, but can also be, as shown schematically, a motor, at least one resistor, which can be a single resistor or composed of several resistors and can have both inductive and capacitive resistance components, and/or a battery. Furthermore, in the embodiment shown, the second load and/or generator component 12 is a resistor, but can also be, as schematically shown, a motor, a generator and/or a battery.

Between the first load and/or generator component 11 and the second load and/or generator component 12, a current can basically flow in a first current direction 21, i.e. from A to B in the FIGURE, as well as in a second current direction 22, i.e. from B to A in the FIGURE.

A first transistor switch 31 and a second transistor switch 32 are connected in series between the first load and/or generator component 11 and the second load and/or generator component 12. The transistor switches 31, 32 are MOSFETs in the embodiment shown, but can also be IGBTs, for example. In the embodiment shown, the transistor switches 31, 32 have a common source terminal. If IGBTs are used for the transistor switches 31, 32 instead of MOSFETs, their emitters are at a common electrical potential.

The common source or emitter potential of the transistor switches forms a reference potential ref for transistor controllers 61, 62 of circuit 1, which are described in more detail below. The reference potential ref can be ground or another potential.

A current measuring device 4 is connected between the two transistor switches 31, 32, with which an actual current $I_{Ist}$ can be measured. The actual current $I_{Ist}$ flows either in the first current direction 21 or in the second current direction 22.

In the embodiment shown in the FIGURE, the current measuring device 4 is followed by a current measuring amplifier 5 with which the measured actual current $I_{Ist}$ can be amplified and its signal can be reversed.

The circuit 1 has a first transistor controller 61 connected to a gate terminal 311 of the first transistor switch 31 and a second transistor controller 61 connected to a gate terminal 321 of the second transistor switch 32. The transistor controllers 61, 62 are, for example, PI or PID controllers with operational amplifiers.

The measured and possibly amplified actual current $I_{Ist}$ is transferred to a controller input 611 of the first transistor controller 61, while the measured, given if amplified and inverted actual current $-I_{Ist}$ is passed to a controller input 621 of the second transistor controller 62.

The circuit 1 also has a digital controller 7. The digital controller 7 is connected to the current measuring amplifier 5 or, in other embodiments, directly to the current measuring device 4; it is also connected to the controller inputs 611, 621 of the transistor controllers 61, 62. The actual current $I_{Ist}$ and the inverted actual current $-I_{Ist}$ are transmitted to the digital controller 7. From the digital controller 7, a target current $I_{Soll1}$ is transmitted as a first reference variable to the controller input 611 of the first transistor controller 61 via a D/A converter not separately shown in the circuit 1, and a target current $I_{Soll2}$ is transmitted as a second reference variable to the controller input 621 of the second transistor controller 62 via a D/A converter. The respective target current value $I_{Soll1}$, $I_{Soll2}$ corresponds to the level of a maximum current that is allowed to flow in the current direction 21 or in the current direction 22 of the circuit 1. The target currents $I_{Soll1}$, $I_{Soll2}$ can be the same or different. In any case, however, a target current $I_{Soll1}$, $I_{Soll2}$ is specified as a reference variable for both transistor controllers 61, 62, i.e. both control channels.

In the circuit 1, a first voltage measuring device 91 is connected in parallel to the first load and/or generator component 11 and a second voltage measuring device 92 is connected in parallel to the second load and/or generator component 12. The first voltage measuring device 91 determines a voltage drop across the first load and/or generator component 11 and transmits it to the digital controller 7. The second voltage measuring device 92 determines a voltage drop across the second load and/or generator component 12 and transmits it to the digital controller 7.

The digital controller 7 is connected to an external control unit 8 via an interface 71, a digital coupler 72 and communication channels 73. The digital coupler 72 forms a galvanic separation between the digital controller 7 and the external control unit 8. For example, a diagnosis of the transistor switches 31, 32 can be carried out via the external control unit 8, which can receive further data, such as temperature measurement values from the circuit 1.

As shown by way of example in the FIGURE, the circuit 1 can have significantly more de-vices or other circuit components, such as a fuse 13 connected in series between the first load and/or generator component 11 and the second load and/or generator component 12.

Depending on the difference between the actual current $I_{Ist}$ and the respective target current $I_{Soll1}$, $I_{Soll2}$, a gate voltage for the gate 311 of the first transistor switch 31 is specified by the first transistor controller 61. The second transistor controller 62 sets a gate voltage for the gate 321 of the second transistor switch 32.

In the present invention, the transistor controllers 61, 62 function as internal controllers which, together with the respective associated transistor switches 31, 32, limit, for example, a short-circuit current in the circuit 1 (see Example 1 below). The digital controller 7 acts as an external controller which detects the same actual current $I_{Ist}$ as the transistor controllers 61, 62, but-depending on the embodiment of the invention—additionally evaluates it.

Various embodiments of the method according to the invention will be explained below using examples with regard to the circuit 1 of shown in the FIGURE:

Example 1

If, for example, a value of 100 A is specified by the digital controller 7 as $I_{Soll1}$ and as $I_{Soll2}$ and the actual current $I_{Ist}$ measured by the current measuring unit 4 is 200 A, both transistor controllers 61, 62 intervene immediately and set the gate voltages of both transistor switches 31, 32 to such values that both transistor switches 31, 32 limit the actual current $I_{Ist}$ to 100 A, i.e. no longer allow a current flow greater than 100 A in the current directions 21, 22. Thus, the transistor controllers 61, 62 together with the transistor switches 31, 32 limit the current flowing through the circuit 1 as soon as a short circuit begins. In any case, the actual current $I_{Ist}$ cannot increase any further. The speed of the reaction of the circuit 1 is mainly due to the fact that the transistor controllers 61, 62 as well as the transistor switches 31, 32 work analogously and the measured actual current $I_{Ist}$ is continuously transmitted to the transistor controllers 61, 62.

Example 2

In a further development of the invention, the respectively measured actual current $I_{Ist}$ is continuously transmitted to the digital controller 7. If the digital controller 7 determines that an energy amount resulting from the measured actual current values list and the associated time exceeds a maximum energy amount, a switch-off signal for the transistor switches 31, 32 is transmitted to the transistor controllers 61, 62 by the digital controller 7. In this embodiment, not only a target current $I_{Soll1}$, $I_{Soll2}$ is transmitted to the transistor controllers 61, 62, but also indirectly via the switch-off signal a specification of target current $I_{Soll1}$, $I_{Soll2}$ and time. This means that the controller 7 then specifies how long the respective target current $I_{Soll1}$, $I_{Soll2}$ in the circuit 1 may be exceeded. Only when the respective target current-time specification is exceeded do the transistor switches 31, 32 switch off by means of the transistor controllers 61, 62.

Example 3

In the above Example 1, the actual current $I_{Ist}$ is limited in the circuit 1 by means of the transistor switches 31, 32, but a short circuit that may exist in the circuit 1 still exists.

Therefore, in a further embodiment of the method according to the invention, the voltage drops across the first load and/or generator component 11 and across the second load and/or generator component 12 are detected with the voltage measuring devices 91, 92 and the corresponding voltages are transmitted to the digital controller 7. The digital controller 7 then evaluates, as in Example 2, the amount of energy resulting from the measured actual current values list and the associated time as well as the voltages dropping across the load and/or generator components 11, 12 and then decides whether a short circuit exists or current peaks are present. Based on this, the digital controller 7 gives the transistor controllers 61, 62 a switch-off signal for the transistor switches 31, 32 or not.

Example 4

With the circuit 1 according to the invention or with the corresponding method, it is possible to switch off the transistor switches 31, 32 and thus the circuit 1 abruptly. However, in some cases this is not desired. In a further embodiment of the method according to the invention, the digital controller 7 can therefore provide the transistor 7 controllers 61, 62 with signals for ramp- or step-like reduction of the actual current $I_{Ist}$. During such a soft shutdown, the actual current $I_{Ist}$ is gradually reduced to zero. Such a soft shutdown is possible for both current directions 21, 22. This can greatly reduce the risk of damage to electronic components of the circuit 1, in particular to the transistor switches 31, 32.

Example 5

Just as in Example 4 a soft shutdown of circuit 1 can be performed, circuit 1 can also be soft switched on. In such an embodiment of the invention, the digital controller 7 provides ramp- or step-shaped switch-on signals to the transistor controllers 61, 62, which convert them into corresponding gate voltages for the transistor switches 31, 32. This has the advantage that, particularly when the circuit 1 has at least one capacitive load and/or generator component 11, 12, the transistor switches 31, 32 do not break so quickly and other components located in the current path are hardly stressed. Due to the ramp- or step-like switching on of the circuit 1, the respective capacitive load and/or generator component 11, 12 does not receive the full current immediately and can be charged gradually. If there is no short circuit, the actual current list can be increased; in the event of a short circuit, it is switched off or the actual current $I_{Ist}$ is reduced to a previous level.

Example 6

Since in the present invention each of the transistor controllers 61, 62 can be given its own target current $I_{Soll1}$ or $I_{Soll2}$, respectively, the actual current $I_{Ist}$ can only be allowed to flow in the first current direction 21 from A to B or only in the second current direction from B to A.

Example 7

In a further embodiment of the invention, the transistor controllers 61, 62 and the transistor switches 31, 32 can each be composed of several, such as five, transistor controller and transistor switch units connected in parallel to one another. Via these cascaded transistor controller and transistor switch units, the current intensity of the actual current $I_{Ist}$ can be increased step by step, e.g. in 200 A steps down to 1 kA. Such transistor controller and transistor switch units can be stacked or expanded as required to increase the current strength.

Example 8

In another embodiment of the invention, it is also possible to cascade the transistor switches 31, 32 by connecting a plurality of semiconductor transistors in parallel to one another in order to form one of the transistor switches 31, 32.

In a further embodiment, the circuit 1 according to the invention can be remotely controlled.

Circuit 1 is independent of whether direct or alternating voltage is used.

The invention claimed is:

1. A method for current control, the method comprising:
providing a circuit with at least one of a first load or generator component and with at least one of a second load or generator component, between which a current can flow in a first current direction or in a second current direction, and with two transistor switches connected in series between the at least one of the first load or generator component and the at least one of the second load or generator component, wherein source or emitter terminals of the transistor switches are electrically short-circuited, and wherein gate voltages at gate terminals of the transistor switches are set by first and second analog transistor controllers respectively associated with the transistor switches, to thus control an actual current by the transistor switches;

measuring the actual current with a current measuring device between the transistor switches and transferring the measured actual current to the transistor controllers, by forwarding the actual current or an amplified value of the actual current to the first transistor controller as a first input signal of the first transistor controller and by forwarding an inverted value thereof to the second transistor controller as a first input signal of the second transistor controller;

providing each of the transistor controllers with a first target current for the first current direction and a second target current for the second current direction by a digital controller; and setting by the transistor controllers corresponding gate voltages for the transistor switches in dependence on a difference between the actual current and the respective target current, to thereby control the actual current by the transistor switches.

2. The method according to claim 1, which comprises continuously forwarding the actual current to the digital controller.

3. The method according to claim 1, which comprises detecting voltage drops across the at least one of the first load or generator component and across the at least one of the second load or generator component and transmitting the voltage drops to the digital controller.

4. The method according to claim 3, which comprises continuously transmitting with the digital controller the actual current and, if applicable, the voltage drops across the at least one of the first load or generator component and across the at least one of the second load or generator component to an external control unit via a digital coupler forming a galvanic separation.

5. The method according to claim 1, which comprises, when the actual current exceeds the respectively predetermined target current over a predetermined period of time, transmitting a switch-off signal by the digital controller to at least one of the transistor controllers.

6. The method according to claim 3, which comprises, when the actual current exceeds the respectively specified target current over a predetermined period of time and a voltage drop across the load and/or generator component associated to the target current falls below a voltage target value, setting the respective target current to zero by the digital controller.

7. The method according to claim 1, which comprises, when the circuit is switched off, decreasing the target current in a ramped or stepped decrease by the digital controller.

8. The method according to claim 7, which comprises, when the circuit is switched on, increasing the target current in a ramped or stepped increase.

9. A current control circuit, comprising:

at least one of a first load or generator component and at least one of a second load or generator component, between which a current can flow in a first current direction or in a second current direction;

two transistor switches connected in series between said at least one of the first load or generator component and the at least one of the second load or generator component, said transistor switches having electrically short-circuited source or emitter terminals;

analog transistor controllers respectively associated with said transistor switches for setting gate voltages and thus controlling an actual current through said transistor switches;

a current measuring device connected between said transistor switches for measuring the actual current, said current measuring device having an output connected to respective controller inputs of said transistor controllers for transmitting a respectively measured actual current, wherein the actual current or an amplified value thereof is forwarded to a first one of said transistor controllers as a first input signal of said first transistor controller and is forwarded invertedly to a second one of said transistor controllers as a first input signal of said second transistor controller; and a digital controller for specifying at least one target current connected to controller inputs of said transistor controllers.

10. The circuit according to claim 9, wherein said controller is directly connected with said current measuring device.

11. The circuit according to claim 9, wherein said controller is connected with said current measuring device via a current amplifier.

12. The circuit according to claim 9, further comprising a first voltage measuring device connected in parallel with said at least one of the first load or generator component and a second voltage measuring device connected in parallel with said at least one of the second load or generator component.

13. The circuit according to claim 9, wherein each of said transistor controllers is a proportional-integral controller or proportional-integral-derivative controllers with operational amplifier.

14. The circuit according to claim 9, wherein said transistor controllers and said transistor switches are composed of a plurality of transistor control units and transistor switch units connected in parallel with one another.

15. The circuit according to claim 9, wherein at least one of said transistor switches is composed of a plurality of semiconductor transistors connected in parallel with one another.

* * * * *